US009502111B2

(12) United States Patent
Dharmapurikar et al.

(10) Patent No.: US 9,502,111 B2
(45) Date of Patent: Nov. 22, 2016

(54) WEIGHTED EQUAL COST MULTIPATH ROUTING (71) Applicant: Cisco Technology, Inc., San Jose, CA (US)

(72) Inventors: Sarang Dharmapurikar, Santa Clara, CA (US); Mohammadreza Alizadeh Attar, Santa Clara, CA (US); Navindra Yadav, Cupertino, CA (US); Ramanan Vaidyanathan, San Jose, CA (US); Kit Chiu Chu, Fremont, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 68 days.

(21) Appl. No.: 14/450,106

(22) Filed: Aug. 1, 2014

(65) Prior Publication Data
US 2015/0124652 A1 May 7, 2015

Related U.S. Application Data (60) Provisional application No. 61/900,314, filed on Nov. 5, 2013.

(51) Int. Cl.
H04L 12/28 (2006.01)
G11C 15/04 (2006.01)
H04L 12/707 (2013.01)
H04L 12/803 (2013.01)

(52) U.S. Cl.
CPC .............. G11C 15/04 (2013.01); H04L 45/24 (2013.01); H04L 47/125 (2013.01)

(58) Field of Classification Search
CPC ...... H04L 45/122; H04L 47/17; H04L 45/02; H04L 47/125; H04L 45/24; G11C 15/04
See application file for complete search history.

(56) References Cited

U.S. PATENT DOCUMENTS

2012/0314581 A1* 12/2012 Rajamanickam ... H04L 41/0826
370/238
2013/0064246 A1* 3/2013 Dharmapurikar ..... H04L 49/351
370/392
2014/0108489 A1* 4/2014 Glines ............... H04L 29/08882
709/201

OTHER PUBLICATIONS

"Optimizing Network Performance using Weighted Multipath Routing" by Zhang et al., dated Aug. 27, 2012.*

* cited by examiner

Primary Examiner — Ayaz Sheikh
Assistant Examiner — Hai-Chang Hsiung
(74) Attorney, Agent, or Firm — Polsinelli PC (57) ABSTRACT In some implementations, network traffic can be routed along equal cost paths based on weights assigned to each path. For example, weighted equal cost multipath routing can be implemented by assigning weights to each equal cost path (e.g., uplink, next hop node) to a destination device. When the network device receives a packet, the network device can generate a key (e.g., a random value, a hash value based on packet data, a value between 0 and n, etc.). The key can be used to select an uplink or path upon which to forward the packet. A key can be generated for a packet flow or flowlet. Each flow can be associated with the same key so that each packet in a flow will be forwarded along the same path. Each flowlet can be forwarded along a different uplink.

12 Claims, 8 Drawing Sheets

FIG. 1

| Node | Next Hops |
|------|-----------|
| 102  | 102       |
| 104  | 102       |
| 106  | -         |
| 108  | 108, 114, 110 |
| 110  | 110       |
| 112  | 108, 114, 110 |
| 114  | 114, 110  |
| 116  | 114, 110  |

FIG. 2

| Uplink \ Node | 102 | 104 | 106 | 108 | 110 | 112 | 114 | 116 |
|---|---|---|---|---|---|---|---|---|
| 102 | 100% | - | - | - | - | - | - | - |
| 104 | 100% | - | - | - | - | - | - | - |
| 106 | - | - | - | - | - | - | - | - |
| 108 | - | - | - | 40% | 20% | - | - | - |
| 110 | - | - | - | - | 100% | - | - | - |
| 112 | - | - | - | 35% | 45% | - | 20% | - |
| 114 | - | - | - | - | 50% | - | 50% | - |
| 116 | - | - | - | - | 15% | - | 85% | - |

| Flowlet ID | Next Hops | Selection | Timestamp |
|---|---|---|---|
| 102 -> 108 | 108, 114, 110 | 110 | t_last |
| 102 -> 112 | 108, 114, 110 | 108 | t_last |
| 102 -> 114 | 114, 110 | 114 | t_last |
| 102 -> 116 | 114, 110 | 110 | t_last |

Random Key Generation per Flowlet

WEIGHTED EQUAL COST MULTIPATH ROUTING

RELATED APPLICATIONS

This application claims priority to U.S. Provisional Patent Application No. 61/900,314, filed on Nov. 5, 2013, the content of which is incorporated herein by reference in its entirety.

TECHNICAL FIELD

The present technology pertains to packet routing.

BACKGROUND

Network traffic is routed through a network based on the cost associated with links between network devices (e.g., routers) along paths from a source device to a destination device. Often the path between the source and the destination having the smallest aggregate cost (e.g., summation of costs associated with each link in a path) is chosen as the path upon which to transmit the network traffic. Sometimes multiple paths between the source device and the destination device have the same (e.g., equal) cost. Since there is not a single cheapest path to select for routing network traffic, a network device implementing typical equal cost multipath routing will randomly select one of the equal cost paths between the source and the destination and transmit network packets on the uplink to the next network device (e.g., next hop) along the randomly selected path.

BRIEF DESCRIPTION OF THE DRAWINGS

In order to describe the manner in which the advantages and features of the disclosure can be obtained, a description of the principles of weighted equal cost multipath routing will be rendered by reference to specific embodiments thereof, which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Overview

In some implementations, a network device (e.g., router, switch, etc.) can forward network traffic along equal cost paths based on weights assigned to uplinks associated with each path. For example, weighted equal cost multipath routing can be implemented by assigning weights to uplinks from a network device to a next hop device associated with each equal cost path to a destination device. The user-assigned weights (e.g., 0% to 100% and totaling 100% for all uplinks) for each uplink from a network device can be converted into ranges of values on a zero to n scale (e.g., 0 to 1023, 0 to 512, etc.). For example, each uplink from the device can be assigned a portion of the zero to 1023 (0-1023) range that corresponds to the weight assigned to the uplink. When the network device receives a packet, the network device can generate a key (e.g., a random value, a hash value based on packet data, a value between 0 and n, etc.) that falls within the range of values. The key can be used to select an uplink upon which to forward the packet. For example, if the key falls within the range of values associated with a particular uplink, the particular uplink will be selected and the network device will forward the packet using the particular uplink to the next hop network device.

In some implementations, a key can be generated for a packet flow or flowlet. For example, a flow can be defined by the source and destination information stored within the packets (e.g., tenant identifier, source IP address, destination IP address, source port, destination port, IP protocol, etc.). Each packet having the same source and destination information can be assigned to a flow. Each flow can be associated with the same key so that each packet in a flow will be forwarded along the same uplink. For example, keys for packet flows can be generated by hashing packet source and destination data. A flowlet can be a portion of a flow that has been separated from a preceding or succeeding portion of a flow by a threshold period of time. Each flowlet can be forwarded along a different uplink (e.g., by using a randomly selected key for each flowlet). All packets within the flowlet can be forwarded along the same uplink. For example, the network device can generate a random key for each flowlet and store the uplink selected using the key in a flowlet forwarding table.

Equal Cost Multipath Routing

Figure 1:
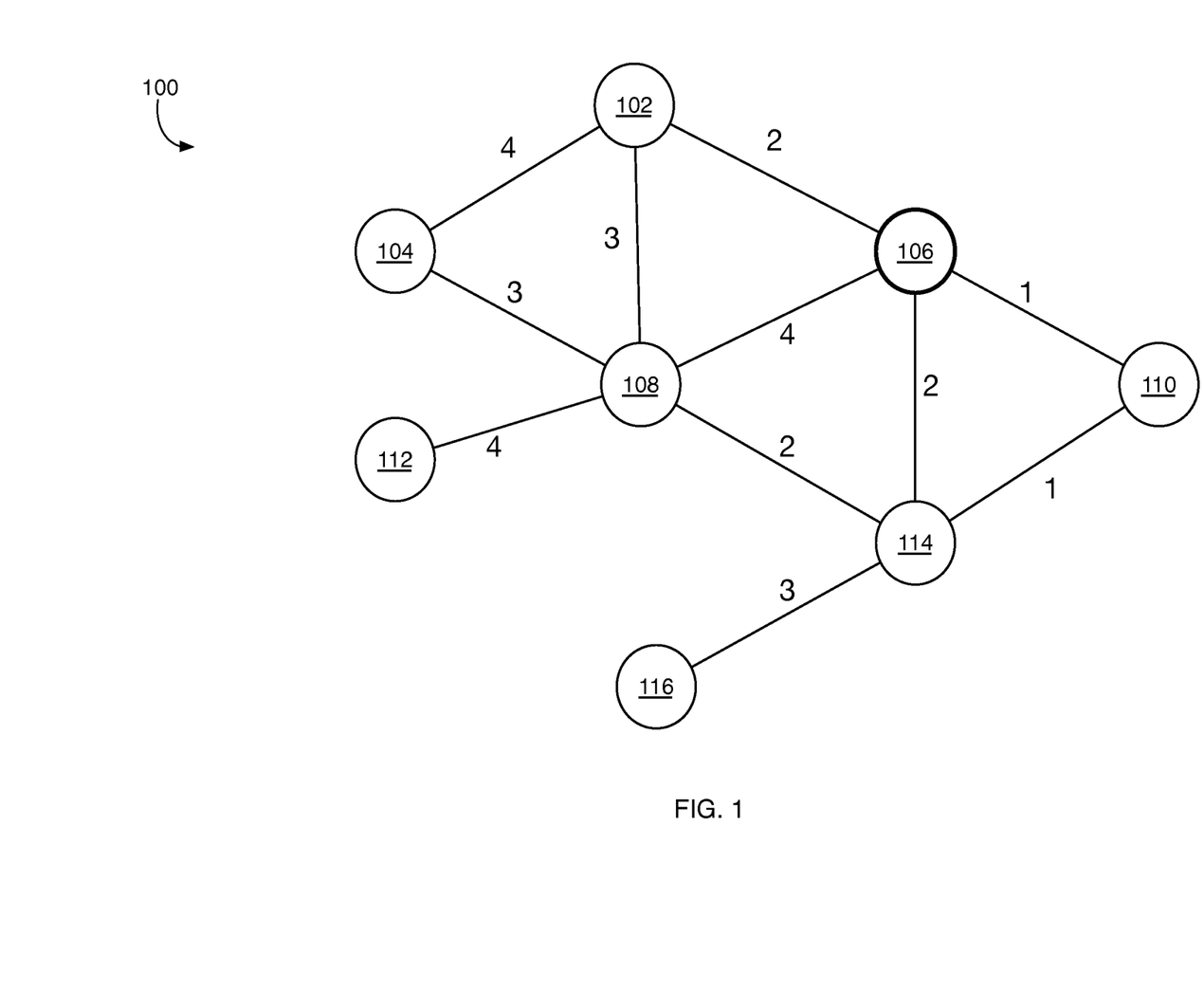
FIG. 1 illustrates a network of nodes that includes paths of equal cost.

FIG. 1 illustrates a network 100 of nodes that includes paths of equal cost. For example, nodes 102-116 can be network devices (e.g., routers, switches, bridges, servers, etc.) that can be configured to route and forward packets using weighted equal cost multipath routing. Each node can be linked with other nodes in the network 100. For example, node 106 is linked to nodes 102, 108, 110 and 114. A direct link from one node to another node upon which a packet is forwarded can be referred to herein as an uplink. Each link can be associated with a cost. For example, the cost of sending a packet from node 106 to node 110 is 1, as indicated by the number adjacent to the line connecting node 106 to node 110 in FIG. 1. The cost for sending a packet from node 102 to node 108 is 3.

The cost of a particular link can be calculated based on throughput, distance, or another metric such as transmission latency, for example. When routing a packet to a destination node, a receiving node will determine the aggregate cost for transmitting the packet to the destination node along a particular path by combining the cost of each link or leg in the path from the receiving node to the destination node. For example, to determine the aggregate cost of a path (e.g., path from node 102 to destination node 116), the cost for each link along the path can be summated. Thus, the cost for transmitting a packet along the path that includes node 102, node 106, node 114, and node 116 is 7 (e.g., 2+2+3).

In some implementations, each node in network 100 can calculate the cost associated with each path to each other node in network 100 and determine the paths to each other node in network 100 having the least cost. For example, node 106 can determine the cost for sending packets to nodes 102, 104, 108, 110, 112, 114 and 116. Here, node 106 can exchange information with the other nodes in network 100 to determine the network layout and link cost using well-known network discovery protocols (e.g., link state protocol).

For example, node 106 has 4 uplinks (e.g., 106 to 102; 106 to 108; 106 to 114; 106 to 110). Node 106 can determine which uplink corresponds the least cost path to node 110. In this case, the least cost path to node 110 is the direct link from node 106 to node 110 (e.g., cost=1); all other paths from node 106 to node 110 cost greater than 1. When forwarding packets, node 106 will chose the uplink (or path) having the least cost. Thus, when routing packets from node 106 to node 110, node 106 will transmit packets over the direct link to node 110.

However, sometimes there are multiple cheapest paths that cost the same. For example, there are two paths from node 106 to node 114 that require the least cost to traverse (e.g., 106 to 110 to 114=2; 106 to 114=2). Typically, when there are multiple cheapest paths that have equal cost, a path or uplink will be selected by the node (e.g. node 106) at random.

Figure 2:
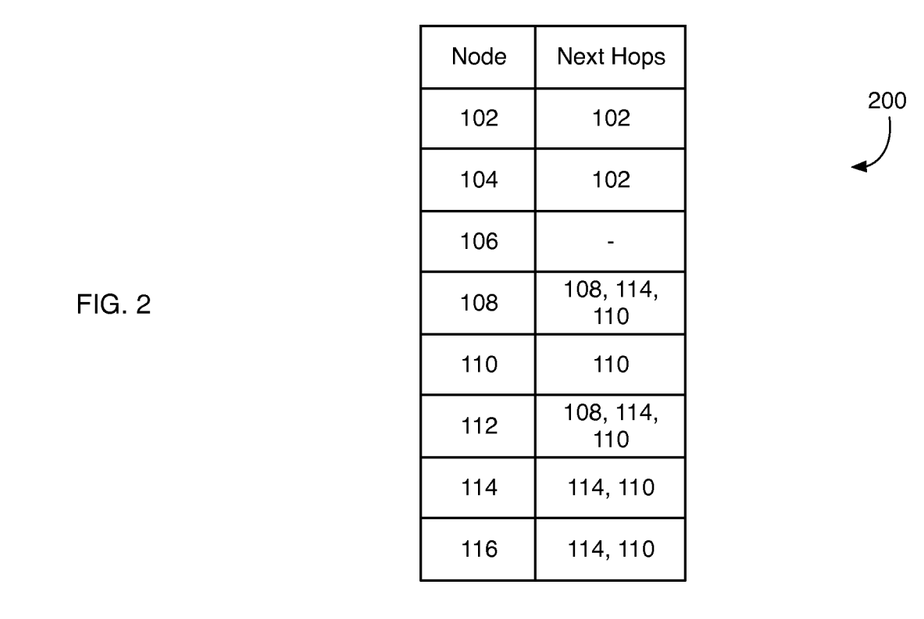
FIG. 2 illustrates an example forwarding table for a network node.

FIG. 2 illustrates an example forwarding table 200 for a network node. For example, forwarding table 200 can represent the forwarding table for node 106 of FIG. 1. In some implementations, a node can generate a forwarding table to keep track of which uplinks provide the shortest (e.g., cheapest) paths to other nodes in the network. For example, node 106 can determine that the uplink to node 102 (e.g., next hop node, next hop network device, adjacent node, etc.) provides the cheapest path to node 102. Node 106 can determine that the uplinks to nodes 108, 110 and 114 all provide the cheapest path to node 108 (e.g., multiple paths with equal cost). Node 106 can determine that the uplinks to nodes 114 and 110 provide the cheapest path to node 116. Node 106 can record the shortest path uplinks for each destination node in table 200.

In some implementations, when there is a single uplink identified in the forwarding table 200 for a destination node (e.g., destination node 102), then node 106 can select the identified uplink for forwarding a received packet.

In some implementations, when there are multiple uplinks identified in the forwarding table 200 for a destination node (e.g., node 108, node 112, node 114, node 116), then node 106 can select one of the identified uplinks randomly or by using another mechanism (e.g., generate a hash value based on packet data). For example, each uplink (e.g., next hop) identified in forwarding table 200 for destination node 108 can be assigned an equal portion of a range of values (e.g., 0 to 1023); this range of values can be referred to herein as a "key range" because the key value used for selecting an uplink will be generated within this range of values. Since node 106 has three least cost uplinks to destination node 108, each uplink will be assigned an equal portion (e.g., ⅓) of the key range of values. For example, the uplink to next hop node 108 can be assigned the range of values 0 to 341. The uplink to next hop node 110 can be assigned the range of values 342 to 682. The uplink to next hop node 114 can be assigned the range of values 683 to 1023. When node 106 receives a packet destined for node 108, node 106 can generate a key (e.g., randomly or by generating a hash value based on packet data) having a value within the key range. Node 106 can compare the generated key to the range of values for each uplink (e.g., "uplink range") and select the uplink having the range of values that includes the generated key value. For example, if value of the key is 356, then node 106 will select the uplink to node 110 because node 110 is associated with values 342-682. Once the uplink is selected, node 106 can forward the packet on the selected link.

Weighted Equal Cost Multipath Routing

Figure 3:
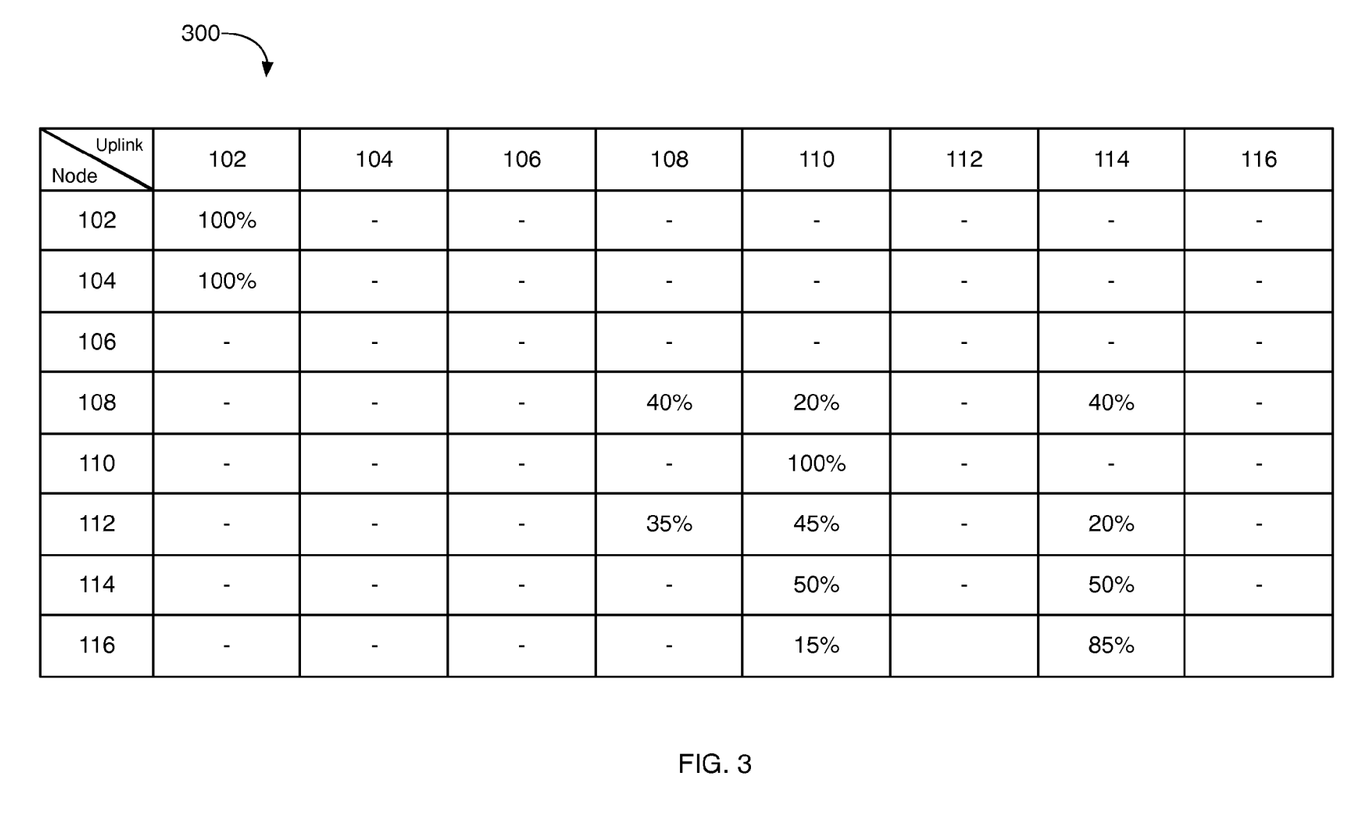
FIG. 3 illustrates an example uplink weight table.

FIG. 3 illustrates an example uplink weight table 300. For example, the implementations described above assign an equal portion of the range of values to each equal cost uplink when determining which uplink to use when forwarding packets. Weight table 300 allows a user to specify weights for each uplink to a destination node that can be used by the network device to divide up the key range values and assign portions of the key range values proportional to the assigned weights to each equal cost uplink. Thus, a user (e.g., network administrator) can cause more network traffic to be forwarded along one equal cost uplink than another equal cost uplink.

In some implementations, an uplink weight table can be configured on each switch in network. For example, uplink weight table 300 can be the uplink weight table for node 106 of FIG. 1. Each row in table 300 can correspond to a destination switch (e.g., left most column) that can be reached from node 106. Each column having a weight entry can correspond to an uplink (e.g., next hop node identified in top most row) from node 106. For example, the uplink from node 106 to node 102 provides the shortest path to node 102. Therefore, 100% of the traffic from node 106 will be routed through the uplink to node 102. There is no uplink from node 106 to node 104; thus, there is no weight entry for uplink 104 in the row for destination node 102.

In some implementations, uplink weight table 300 can specify weights for equal cost paths. For example, there are three uplinks that provide equal cost paths to destination node 108 (e.g., 108, 110, and 114). A user (administrator) can enter values for each of the equal cost paths into the uplink weight table to specify the proportion of network traffic that should be forwarded along each equal cost path. For example, for network traffic routed by node 106 to destination node 108, the user can specify that 40% of the traffic should be forwarded to uplink 108, 20% of the network traffic should be forwarded to uplink 110, and 40% of the network traffic should be forwarded to uplink 114. Other examples of weights assigned to equal cost paths can be seen in rows corresponding to destination node 112, destination node 114 and destination node 116. The sum of the weights for the equal cost uplinks to a particular destination node should equal 100%, for example.

Figure 4:
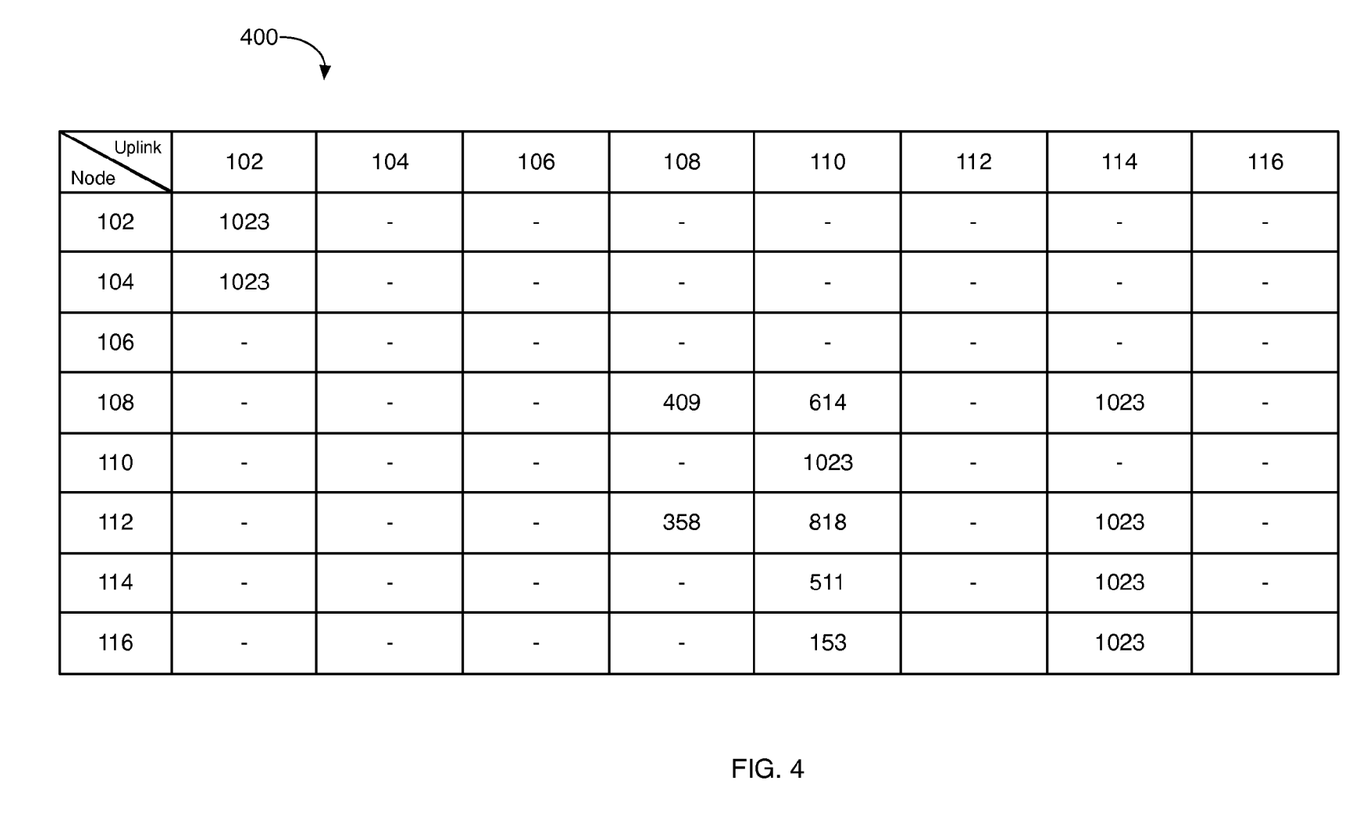
FIG. 4 illustrates a weighted forwarding table that specifies ranges of values for selecting which uplink to user when routing network traffic to destination nodes.

FIG. 4 illustrates a weighted forwarding table 400 that specifies ranges of values for selecting which uplink to user when routing network traffic to destination nodes. In some implementations, the weights assigned to the uplinks in table 300 of FIG. 3 can be converted into range values, as illustrated by forwarding table 400 of FIG. 4. For example, a key range (e.g., 0-1023) can be portioned and assigned to uplinks according to the weights assigned in table 300 of FIG. 3. If a weight of 30% is assigned to an uplink in table 300, then, for example, a portion of the key range proportionate to the 30% weight (e.g., 0-307) can be assigned to the uplink.

If there are multiple equal cost shortest paths, table 400 can specify a portion of the key range proportional to the weight assigned in table 300 for each uplink associated with each equal cost path. For example, there are three uplinks (e.g., node 108, node 110 and node 114) to three shortest cost paths from node 106 to destination node 112. For destination node 112, the uplink from node 106 to node 108 can be assigned a range 0-358 (e.g., 35% of 1023), the uplink from node 106 to node 110 can be assigned the range 359-818 (e.g., 45% of 1023), and the uplink from node 106 to node 114 can be assigned the range 818-1023 (e.g., 20% of 1023).

In some implementations, each range of values for each uplink can be indicated by specifying the highest value in the range (e.g., 358, 818, 1023) in the table for each uplink. Node 106 can determine the range portion of a particular uplink (e.g., uplink 110) by comparing the value for the previous uplink (e.g., if ordered left to right, the previous uplink is the next uplink to the left having an assigned weight; if ordered right to left, the previous uplink is the next uplink to the right having an assigned weight) in the table (e.g., uplink 108: value 358) to the value specified in the table for the particular uplink (e.g., uplink 110: value 818). For example, the node 106 can determine that the range for uplink 110 to destination node 112 is 359-818 because the value of previous uplink 108 is 358 and the value of uplink 110 is 818. If there is no previous uplink value in the table for a particular destination, the node will use zero (0) as the previous value. Thus, because there is no previous uplink value for uplink node 108 (value 358) in row 112, the range of values for the uplink to node 108 is 0-358.

In some implementations, a user (e.g., administrator) can specify the values in table 400. For example, instead of specifying weights as percentages in table 300 and then converting the percentages into range values, the user can just enter range values in table 400. However, it may be easier for a user to specify weights as a percentage than for the user to calculate the range values of table 400.

In some implementations, the values specified in table 400 can be used to forward network traffic to next hop nodes. For example, when node 106 receives a network packet, node 106 can generate a key value. The key value can be randomly generated or generated based on data in packets received at node 106. If the key value falls within a range of values specified for an uplink (e.g., next hop node) by table 400, the packet will be forwarded along that uplink. For example, if node 106 receives a packet destined for node 116, the packet can be forwarded to next hop node 110 or next hop node 114, according to table 400. Upon receiving the packet, node 106 can generate a key value. For example, the key value can be 478. Node 106 can compare the key value to the value range for node 110 (e.g., 0-153) and determine that the packet should not be forwarded to node 110 because the key value 478 does not fall within the range of values 0-153 specified for next hop node 110. Node 106 can compare the key value to the value range for next hop node 114 and determine that the packet should be forwarded to node 114 because the key value 478 falls within the range of values 154-1023. Node 106 can then forward the packet to on the uplink directly connected to next hop node 114.

In some implementations, a node configured for weighted equal cost multipath routing can automatically revert back to standard unweighted equal cost multipath routing. For example, if an uplink from a particular node to a next hop node fails, the particular node will stop using the weighted equal cost multipath routing and will use an unweighted (e.g., equal weight or equal distribution) equal cost multipath routing scheme. For example, the range of values used to select an uplink will be distributed equally among the active equal cost uplinks.

Flows and Flowlets

In some implementations, flows can be distributed across uplinks using the weighted equal cost multipath techniques described above. For example, a flow can be identified based on source and destination information in a packet. Packets that have different sources and/or different destinations belong to different flows. Packets that have the same source and destination information can be part of the same flow. For example, a flow can be identified using the following six pieces (e.g., 6-tuple) of data from a packet: tenant identifier, source IP address, destination IP address, source port, destination port, and IP protocol. Upon packet arrival at a node, the 6-tuple is extracted from the packet header. A key is generated using the extracted fields by providing the fields as input to a hash function. The hash function will generate a 10-bit hash value that will be used as the key for determining which uplink to forward packets on, as described above. Since the same header fields will be used to generate the hash value for each packet in a flow, all of the packets in the flow will be forwarded on the same uplink to the same next hop node. Since all packets within a flow are forwarded on the same uplink, there will be no packet reordering; each packet will arrive at the destination in the proper order. Moreover, since the 10-bit hash is expected to be uniformly distributed, the node will assign a smaller number of flows to an uplink with a smaller weight and a larger number of flows to an uplink with a larger weight.

In some implementations, flowlets can be load balanced across multiple uplinks. For example, a flowlet can be a portion of a flow (e.g., a series of packets having the same source and destination) that is separated from a previous portion of the same flow by a threshold period of time. The threshold period of time can be determined based on an estimated amount of time (e.g., packet latency, network latency) it takes for the packet to reach its destination from a transmitting node. If the threshold period of time has elapsed since a packet in a flow was transmitted from the node to the destination, then a subsequent packet in the same flow can be forwarded on a different uplink than the previous packet without risking that the destination node will receive the packets in the flow out of order. The threshold period of time can be specified by a user/administrator or automatically determined by a network device.

Figure 5:
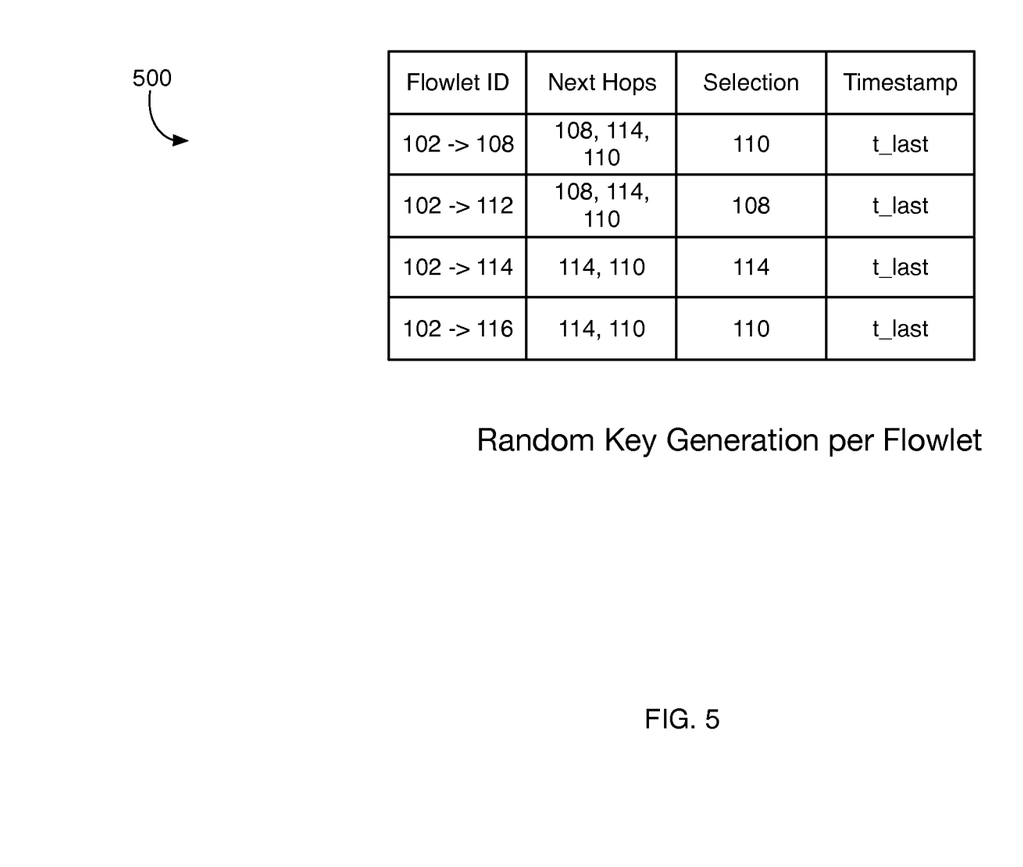
FIG. 5 illustrates a flowlet forwarding table.

FIG. 5 illustrates a flowlet forwarding table 500. For example, each flowlet can be forwarded on an uplink selected based on a randomly generated key. The key can be compared to the range of values corresponding to each uplink to a destination node, as described with reference to FIG. 4, to select which uplink upon which to forward the flow. Once the uplink (e.g., next hop node) is selected, the selected uplink can be stored in table 500. For example, table 500 can store flowlet forwarding information for a node (e.g., node 106). Table 500 can include information identifying a flowlet (e.g., source and destination information), shortest path uplink information (e.g., next hops), the selected uplink (e.g., selection), and/or a timestamp of the last transmitted packet having the same source and destination.

When a packet arrives at a node, the node can determine the flowlet identifier (e.g., source/destination information), look up the flowlet in table 500 based on the flowlet identifier and obtain the last uplink selection and the timestamp of the last flowlet packet transmitted. The node can determine the elapsed time since the last flowlet packet was transmitted by calculating the difference between the current time and the timestamp obtained from table 500. If the elapsed time is less than a threshold period of time (e.g., 1 ms, configured by an administrator or automatically determined), then the received packet will be forwarded on the uplink identified in table 500. If the elapsed time is greater than the threshold period of time, then the node will randomly generate a new key and use the key to determine a new uplink upon which to forward the received packet based on the weighted forwarding table 400 of FIG. 4. The node will record the new uplink in table 500 for forwarding subsequent packets in the same flowlet. Thus, the node can randomly distribute flowlets to uplinks to load balance the network traffic according to the weights assigned to each uplink.

Figure 6:
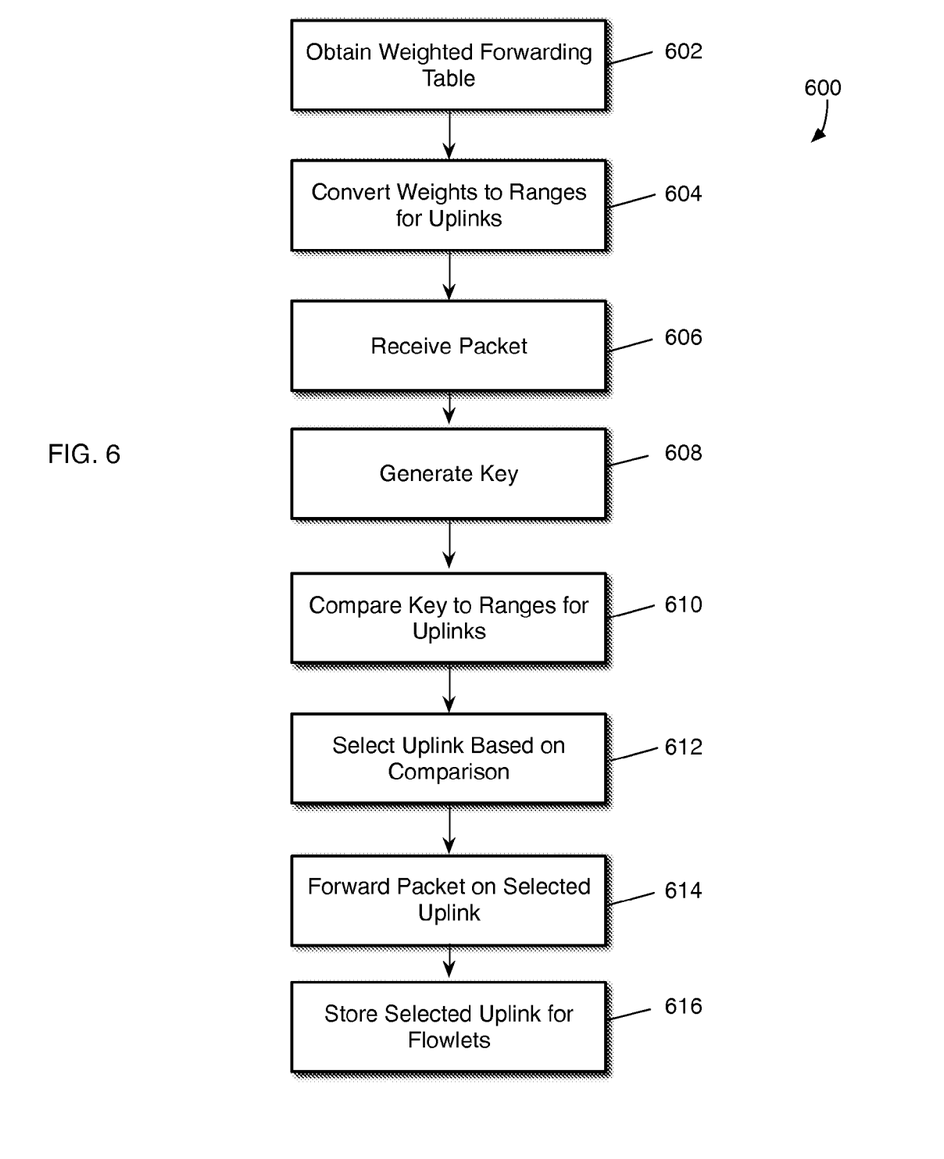
FIG. 6 is a flow diagram of an example weighted equal cost multipath routing process.

FIG. 6 is a flow diagram of an example weighted equal cost multipath routing process 600. For example, process 600 can be performed to distribute network traffic on equal cost uplinks according to a user (e.g., network administrator) specified distribution.

At step 602, a network node can obtain an uplink weight table. For example, a user or network administrator can generate an uplink weight table and make the uplink weight table accessible to the network node. The network node can store the weighted forwarding table locally or access the weighted forwarding table from a network source device. The uplink weight table can specify weights for each equal cost uplink to the destination nodes identified in the weighted forwarding table. The weights can represent a portion of a whole and when all of the uplink weights for a destination node are added together the summation should equal the whole. For example, if the weights are specified as percentages, then the summation of all uplink weights for a destination node should equal 100%. If the weights are specified as a portion of a range of values (e.g., key range, 0-1023), then the weights for each uplink to a destination node should cover all values of the range. The uplink weight table can be similar to the forwarding table 300 of FIG. 3, for example.

At step 604, the network node can convert the weights specified in the uplink weight table into ranges for the uplinks identified in the uplink weight table. For example, the network node can convert each weight into a range of values that is a portion of the key range. For example, the key range, described above, can be 0-1023. The range of values for an uplink can be a portion of the key range proportionate to the weight specified in the uplink weight table. If the weight for an uplink is 47%, then the range of values for the uplink will cover 47% of the key range of values. Once each of the user specified uplink weights in the uplink weight table are converted into a range of values, the range of values for each uplink can be stored in a weighted forwarding table, such as the weighted forwarding table 400 of FIG. 4.

At step 606, the network node can receive a packet. Upon receipt of a packet, the network node can obtain source and destination information from the packet. The network node can determine if the packet should be processed according to a flow packet load balancing technique or a flowlet load balancing technique. For example, the network node can be configured by the network administrator (e.g., user) to load balance packets as flows or flowlets.

At step 608, the network node can generate a key. For example, if the network node determines that the packet is to be processed using the flow load balancing technique, then a key can be generated by hashing the source and destination information (e.g., the 6-tuple described above) extracted from the packet header. If the network node determines that the packet is to be processed according to the flowlet load balancing technique, then the network node can determine that a threshold period of time has passed since the last packet having the same flowlet identifier was transmitted from the network node and generate a new random key, as described above with reference to FIG. 5.

At step 610, the network node can compare the generated key to the range of values associated with an equal cost uplink for the destination node specified in the packet. For example, the network node can compare the generated key to the range of values associated with the equal cost uplinks in the weighted forwarding table to determine whether the key falls within the range specified for an uplink.

At step 612, the network node can select an uplink based on the comparison performed at step 610. For example, if the network node determines that the generated key falls within the range of values for a particular uplink, the network node can select the particular uplink for forwarding the packet.

At step 614, the network node can forward the packet on the selected uplink. For example, the network node can forward the packet on the uplink selected at step 612.

At step 616, the network node can store the selected uplink in the flowlet forwarding table. For example, the network node can store the selected uplink in table 500 of FIG. 5 so that subsequent packets in the same flowlet can be forwarded on the same uplink.

Example Devices

Figure 7:
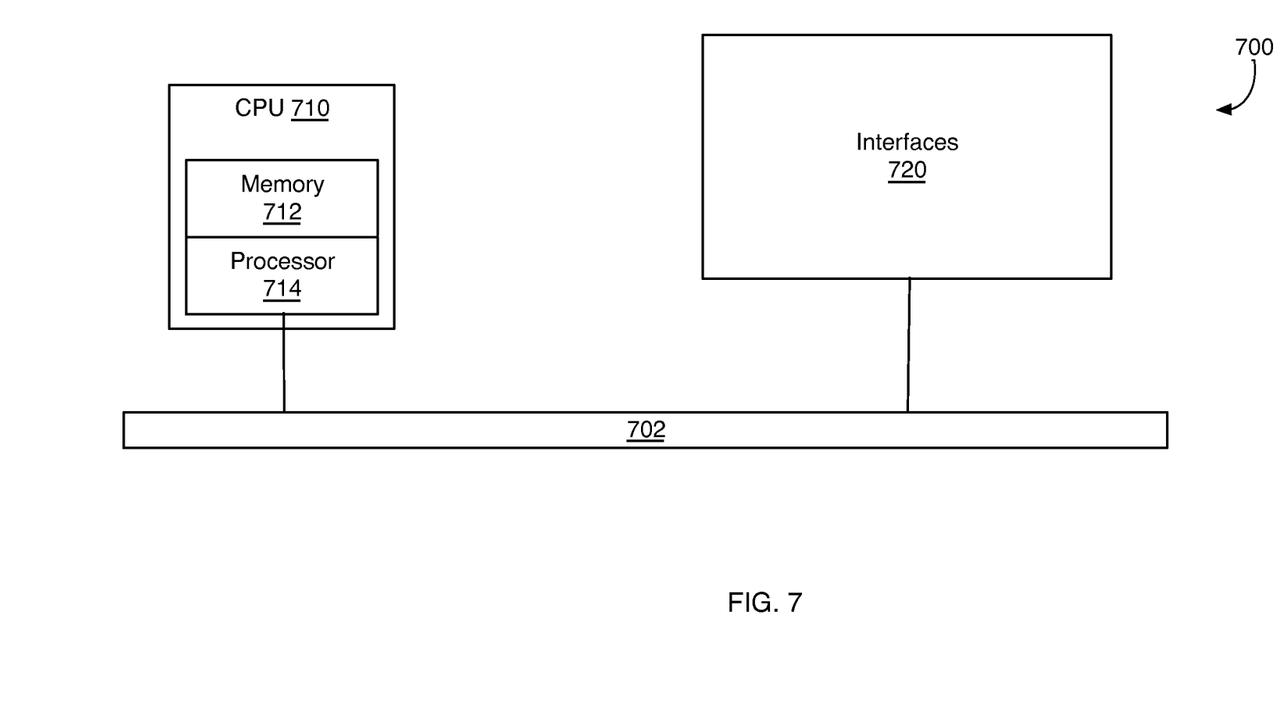
FIG. 7 illustrates an example network device suitable for implementing weighted equal cost multipath routing.

FIG. 7 illustrates an example network device 700 suitable for implementing weighted equal cost multipath routing. Network device 700 includes a master central processing unit (CPU) 710, interfaces 720, and a bus 702 (e.g., a PCI bus). When acting under the control of appropriate software or firmware, the CPU 710 is responsible for executing packet management, error detection, and/or routing functions, such as miscabling detection functions, for example. The CPU 710 preferably accomplishes all these functions under the control of software including an operating system and any appropriate applications software. CPU 710 may include one or more processors 714 such as a processor from the Motorola family of microprocessors or the MIPS family of microprocessors. In an alternative embodiment, processor 714 is specially designed hardware for controlling the operations of router 700. In a specific embodiment, a memory 712 (such as non-volatile RAM and/or ROM) also forms part of CPU 710. However, there are many different ways in which memory could be coupled to the system.

The interfaces 720 are typically provided as interface cards (sometimes referred to as "line cards"). Generally, they control the sending and receiving of data packets over the network and sometimes support other peripherals used with the router 700. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 710 to efficiently perform routing computations, network diagnostics, security functions, etc.

Although the system shown in FIG. 7 is one specific network device for implementing dynamic addressing of virtual port channels, it is by no means the only network device architecture on which dynamic addressing of virtual port channels can be implemented. For example, an architecture having a single processor that handles communications as well as routing computations, etc. is often used. Further, other types of interfaces and media could also be used with the router.

Regardless of the network device's configuration, it may employ one or more memories or memory modules (including memory 712) configured to store program instructions for the general-purpose network operations and dynamic addressing of virtual port channels, as described herein. The program instructions may control the operation of an operating system and/or one or more applications, for example. The memory or memories may also be configured to store weighted equal cost multipath instructions and forwarding tables, for example. In some implementations, network device 700 can include system architecture 800, described below.

Figure 8:
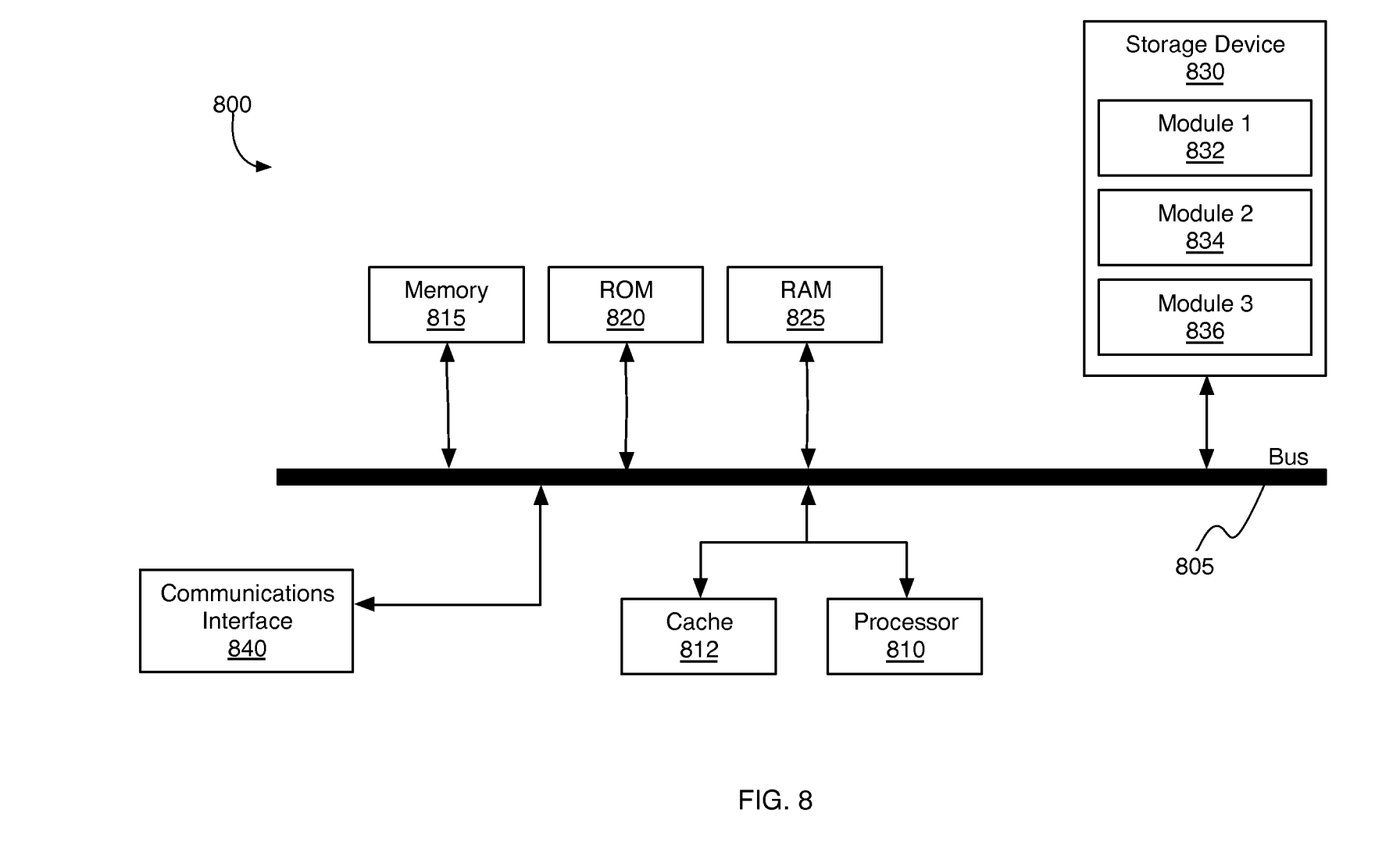
FIG. 8 illustrates an example computing system architecture.

FIG. 8 illustrates an example computing system architecture 800 wherein the components of the system 800 are in electrical communication with each other using a bus 805. System 800 includes a processing unit (CPU or processor) 810 and a system bus 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions.

Other system memory 815 may be available for use as well. The memory 815 can include multiple different types of memory with different performance characteristics. The processor 810 can include any general purpose processor and a hardware module or software module, such as module 6 832, module 7 834, and module 3 836 stored in storage device 830, configured to control the processor 810 as well as a special-purpose processor where software instructions are incorporated into the actual processor design. The processor 810 may essentially be a completely self-contained computing system, containing multiple cores or processors, a bus, memory controller, cache, etc. A multi-core processor may be symmetric or asymmetric.

The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of non-transitory computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof. The storage device 830 can include computer code and instructions which can be executed by one or more processors to perform one or more operations according to the code and instructions. For example, the non-transitory computer readable media can store instructions which, when executed by a processor, causes the processor to perform operations defined in the instructions.

The storage device 830 can include software modules 832, 834, 836 for controlling the processor 810. The software modules can include instructions for performing weighted equal cost multipath routing, for example. Other hardware or software modules are contemplated. The storage device 830 can be connected to the system bus 805. In one aspect, a hardware module that performs a particular function can include the software component stored in a computer-readable medium in connection with the necessary hardware components, such as the processor 810, bus 805, display 835, and so forth, to carry out the function.

For clarity of explanation, in some instances the present technology may be presented as including individual functional blocks including functional blocks comprising devices, device components, steps or routines in a method embodied in software, or combinations of hardware and software.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

We claim:

1. A method comprising:
   receiving user-specified weights for each equal cost uplink from a first network device to a destination device;
   obtaining, at a first network device, a weighted forwarding table comprising the user-specified weights, each of the user-specified weights representing a respective proportion of network traffic to transmit on each equal cost uplink from the first network device to the destination device;
   receiving, by the first network device, a network packet;
   generating, for each equal cost uplink, a respective portion of a key value range, the respective portion of the key value range corresponding to the user-specified weights, and wherein the weighted forwarding table maps the respective portion of the key value range to each equal cost uplink to the destination device;

storing information identifying the respective portion of the key value range corresponding to each equal cost uplink in the weighted forwarding table; and forwarding the network packet on an uplink identified in the weighted forwarding table based on the respective portion of the key value range of the uplink.

2. The method of claim 1, wherein the network packet is associated with a flow, and wherein a key value is randomly generated for each flowlet received by the first network device.

3. The method of claim 1, wherein generating the respective portion of the key value range comprises dividing the key value range into a plurality of portions of the key value range, wherein each of the plurality of portions is proportional to a respective one of the user-specified weights.

4. The method of claim 1, wherein the respective portion comprises a respective key value, the method further comprising comparing the respectively key value to the weighted forwarding table and determining that the respective key value falls within the respective portion of the key value range corresponding to an identified uplink.

5. A non-transitory computer-readable medium including one or more instructions which, when executed by one or more processors, cause the one or more processors to perform operations comprising:

obtaining, at a first network device, a weighted forwarding table that specifies proportions of network traffic to transmit on each equal cost uplink from the first network device to a destination device, the proportions comprising user-specified weights for each equal cost uplink from the first network device to the destination device;

converting the user-specified weights for each equal cost uplink into portions of a key value range proportionate to the user-specified weights;

storing information identifying a respective portion of the key value range corresponding to each equal cost uplink in the weighted forwarding table;

receiving, by the first network device, a network packet;

generating a key value within the key value range;

comparing the key value to the weighted forwarding table; and forwarding the network packet on an uplink identified in the weighted forwarding table based on the comparison.

6. The non-transitory computer-readable medium of claim 5, wherein the network packet is associated with a flow, wherein a respective key value is randomly generated for each flowlet received by the first network device.

7. The non-transitory computer-readable medium of claim 5, wherein comparing the key value to the weighted forwarding table comprises determining which of the portions of the key value range includes the key value.

8. The non-transitory computer-readable medium of claim 5, wherein comparing the key value to the weighted forwarding table comprises determining that the key value is within a respective one of the portions of the key value range.

9. A system comprising:

one or more processors; and a computer-readable storage device including instructions which, when executed by one or more processors, cause the one or more processor to perform operations comprising:

receiving user-specified weights for each equal cost uplink from a first network device to a destination device;

obtaining, at a first network device, a weighted forwarding table comprising the user-specified weights, each of the user-specified weights representing a respective proportion of network traffic to transmit on each equal cost uplink from the first network device to the destination device;

receiving, by the first network device, a network packet;

generating, for each equal cost uplink, a respective portion of a key value range, the respective portion of the key value range corresponding to the user-specified weights, and wherein the weighted forwarding table maps the respective portion of the key value range to each equal cost uplink to the destination device;

storing information identifying the respective portion of the key value range corresponding to each equal cost uplink in the weighted forwarding table; and forwarding the network packet on an uplink identified in the weighted forwarding table based on the respective portion of the key value range of the uplink.

10. The system of claim 9, the operations further comprising generating a key value randomly for each flowlet received by the first network device.

11. The system of claim 9, the operations further comprising generating a key value for one or more flows received by the first network device, the key value comprising a hash value generated based on source and destination information for each of the one or more flows received by the first network device.

12. The system of claim 9, the operations further comprising comparing one or more respective values associated with the respective portion with the weighted forwarding table and determining that the one or more respective values fall within a portion of a respective key value range corresponding to the uplink.

* * * * *